(12) United States Patent
Rathburn

(10) Patent No.: US 9,276,339 B2
(45) Date of Patent: Mar. 1, 2016

(54) ELECTRICAL INTERCONNECT IC DEVICE SOCKET

(75) Inventor: James Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 157 days.

(21) Appl. No.: 13/880,231

(22) PCT Filed: Nov. 29, 2011

(86) PCT No.: PCT/US2011/062321
§ 371 (c)(1),
(2), (4) Date: Apr. 18, 2013

(87) PCT Pub. No.: WO2012/074969
PCT Pub. Date: Jun. 7, 2012

(65) Prior Publication Data
US 2013/0210276 A1    Aug. 15, 2013

Related U.S. Application Data

(63) Continuation-in-part of application No. 13/320,285, filed as application No. PCT/US2010/036282 on May 27, 2010, application No. 13/880,231, which is a continuation-in-part of application No. 13/575,368, (Continued)

(51) Int. Cl.
*H01R 12/70* (2011.01)
*H01R 11/16* (2006.01)
(Continued)

(52) U.S. Cl.
CPC ............ *H01R 12/7082* (2013.01); *H01R 11/16* (2013.01); *H01R 12/714* (2013.01); *H01R 43/00* (2013.01); *H05K 7/1061* (2013.01); *H01R 13/24* (2013.01); *Y10T 29/49208* (2015.01)

(58) Field of Classification Search
CPC ....... H05K 3/222; H05K 3/303; H05K 3/325; H05K 7/023; H05K 7/1061; H05K 7/20436; H01R 13/22; H01R 13/26; H01R 13/6625; H01R 11/16; H01R 12/7082; H01R 12/714; H01R 13/24; H01R 13/62938; H01R 13/62983
See application file for complete search history.

(56) References Cited

U.S. PATENT DOCUMENTS 3,672,986 A   6/1972 Schneble, Jr. et al.
4,188,438 A   2/1980 Burns
(Continued)

FOREIGN PATENT DOCUMENTS

JP     2003/217774    7/2003
WO    WO 91/14015    9/1991
(Continued)

OTHER PUBLICATIONS

Liu, et al, "All-Polymer Capacitor Fabricated with Inkjet Printing Technique," Solid-State Electronics, vol. 47, pp. 1543-1548 (2003).
(Continued)

*Primary Examiner* — Briggitte R Hammond

(57) ABSTRACT

A surface mount electrical interconnect adapted to provide an interface between contact pads on an LGA device and a PCB. The electrical interconnect includes a socket substrate having a first surface with a plurality of first openings having first cross-sections, a second surface with a plurality of second openings having second cross-sections, and center openings connecting the first and second openings. The center openings include at least one cross-section greater than the first and second cross-sections. A plurality of contact members are located in the socket substrate such that first contact tips are located proximate the first openings, second contact tips are located proximate the second openings, and center portions located in the center openings.

20 Claims, 26 Drawing Sheets

Related U.S. Application Data filed as application No. PCT/US2011/023138 on Jan. 31, 2011, now abandoned, application No. 13/880,231, which is a continuation-in-part of application No. 13/643,436, filed as application No. PCT/US2011/033726 on Apr. 25, 2011, now Pat. No. 9,184,145, application No. 13/880,231, which is a continuation-in-part of application No. 13/410,914, filed as application No. PCT/US2011/062321 on Nov. 29, 2011.

(60) Provisional application No. 61/419,425, filed on Dec. 3, 2010, provisional application No. 61/420,031, filed on Dec. 6, 2010, provisional application No. 61/183,340, filed on Jun. 2, 2009, provisional application No. 61/300,628, filed on Feb. 2, 2010, provisional application No. 61/327,795, filed on Apr. 26, 2010, provisional application No. 61/448,288, filed on Mar. 2, 2011.

(51) Int. Cl.
*H01R 12/71* (2011.01)
*H05K 7/10* (2006.01)
*H01R 43/00* (2006.01)
*H01R 13/24* (2006.01)

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozier et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn et al. |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |

(56) References Cited

U.S. PATENT DOCUMENTS

| | | |
|---|---|---|
| 7,040,902 B2 | 5/2006 | Li |
| 7,045,015 B2 | 5/2006 | Renn |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |

(56) References Cited

U.S. PATENT DOCUMENTS

| | | |
|---|---|---|
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King et al. |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | 2008/156856 | 12/2008 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO-2015/006393 | 1/2015 |

(56) References Cited

FOREIGN PATENT DOCUMENTS

OTHER PUBLICATIONS

Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Co-pending U.S. Appl. No. 13/575,368, titled High Speed Backplane Connector, filed Jul. 26, 2012.
Co-pending U.S. Appl. No. 13/643,436 titled Semiconductor Device Package Adapter, filed Oct. 25, 2012.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,461 titled Electrical Interconnect IC Device Socket, filed Apr. 19, 2013.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.

Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.

(56) References Cited

OTHER PUBLICATIONS

Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.

(56) References Cited

OTHER PUBLICATIONS

Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.

(56) References Cited

OTHER PUBLICATIONS

Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.

(56) References Cited

OTHER PUBLICATIONS

Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.

(56) References Cited

OTHER PUBLICATIONS

Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No, US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.

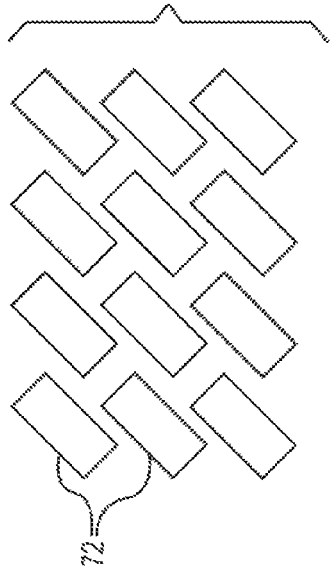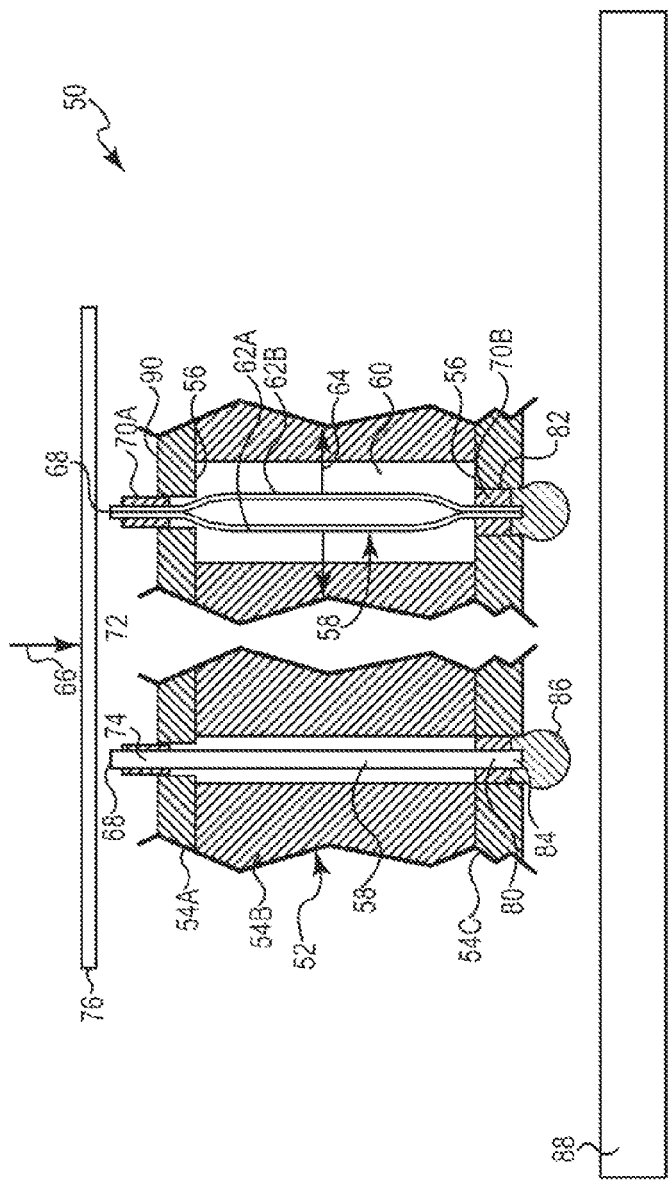

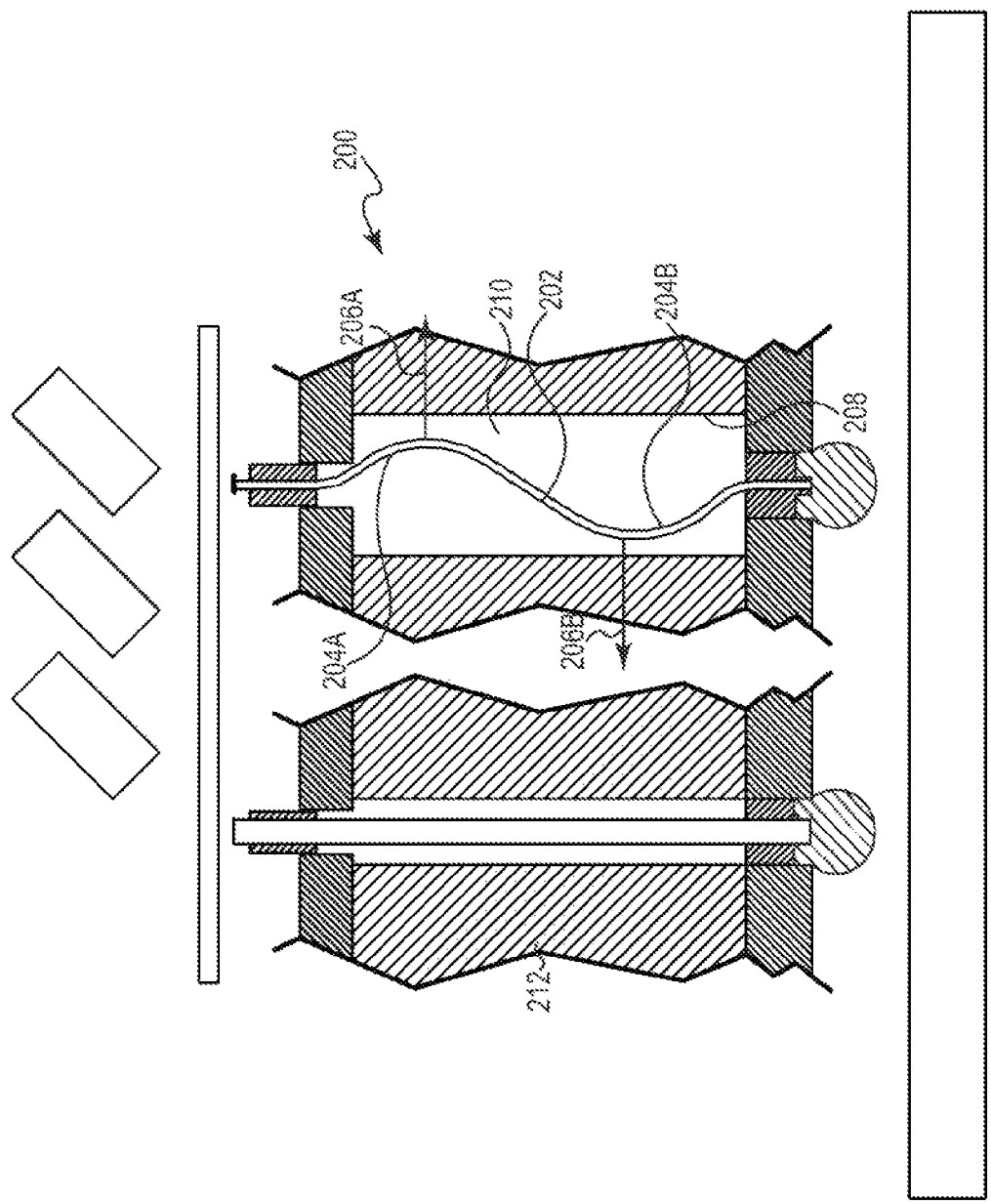

ELECTRICAL INTERCONNECT IC DEVICE SOCKET

CROSS-REFERENCE TO RELATED APPLICATIONS

This application claims the benefit of a national stage application under 35 U.S.C. §371 of International Application No. PCT/US2011/062321, titled ELECTRICAL INTERCONNECT IC DEVICE SOCKET, filed Nov. 29, 2011, which claims priority to U. S. Provisional Application No. 61/419,425 filed Dec. 3, 2010 and 61/420,031 filed Dec. 6, 2010, all of which are hereby incorporated by reference in their entireties.

This application is a continuation-in-part of U.S. patent application Ser. No. 13/320,285, titled COMPLIANT PRINTED FLEXIBLE CIRCUIT, filed Nov. 14, 2011, which is a national stage application under 35 U.S.C. §371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, all of which are hereby incorporated by reference in their entireties.

This application is a continuation-in-part of U.S. patent application Ser. No. 13/575,368, titled HIGH SPEED BACKPLANE CONNECTOR, filed Jul. 26, 2012, which is a national stage application under 35 U.S.C. §371 of International Application No. PCT/US2011/023138, titled HIGH SPEED BACKPLANE CONNECTOR, filed Jan. 31, 2011, which claims priority to U.S. Provisional Application No. 61/300,628, filed Feb. 2, 2010, all of which are hereby incorporated by reference in their entireties.

This application is a continuation-in-part of U.S. patent application Ser. No. 13/643,436, titled SEMICONDUCTOR DEVICE PACKAGE ADAPTER, filed Dec. 6, 2012, which is a national stage application under 35 U.S.C. §371 of International Application No. PCT/US2011/033726, titled SEMICONDUCTOR DEVICE PACKAGE ADAPTER, filed Apr. 25, 2011, which claims priority to U.S. Provisional Application No. 61/327,795, filed Apr. 26, 2010, all of which are hereby incorporated by reference in their entireties.

This application is a continuation-in-part of U.S. patent application Ser. No. 13/410,914, titled METALIZED PAD TO ELECTRICAL CONTACT INTERFACE, filed Mar. 2, 2012, which claims priority to U.S. Provisional Application No. 61/448,288, filed Mar. 2, 2011, both of which are hereby incorporated by reference in their entireties.

TECHNICAL FIELD

The present disclosure relates to an electrical interconnect IC device socket, and in particular, to a surface mount LGA device sockets. The present disclosure also discloses the use of unique fabrication techniques that merge processes used in the printed circuit and semiconductor packaging industries with the flexibility of additive printing technology to make the present surface mount electrical interconnect.

BACKGROUND OF THE INVENTION

Traditional IC sockets are generally constructed of an injection molded plastic insulator housing that includes stamped and formed copper alloy contact members stitched or inserted into recesses. The assembled IC socket is then generally processed through a reflow oven to attach solder balls to the contact members. During final assembly the contact pads on the printed circuit board ("PCB") are printed with solder paste or flux and the solder balls on the IC socket are placed in registration with the contact pads. The assembly is then reflowed and the solder balls essentially weld the IC socket to the PCB.

During use the IC socket receives an IC device, such as packaged integrated circuits. The contact members electrically couple the terminals on the IC device with the corresponding terminal on the PCB. The terminals on the IC device are typically held against the contact members by applying a load, which is expected to maintain intimate contact and reliable circuit connection throughout the life of the system without a permanent connection. As a result, the IC device can be removed or replaced without the need for reflowing solder connections.

These types of IC sockets and interconnects have been produced in high volume for many years. As IC devices advance to next generation architectures traditional IC sockets have reached mechanical and electrical limitations that require alternate methods. For example, increased terminal count, reduction in the distance between the contacts known as terminal pitch, and signal integrity have been the main drivers that impact the IC socket design. As terminal counts go up, the IC package essentially gets larger due to the additional space needed for the terminals. As the package grows larger, costs go up and the relative flatness of the package and corresponding PCB require compliance between the contact members in the IC socket and the terminal pad to accommodate the topography differences and maintain reliable connection.

As the terminal pitch is decreased the thickness of the insulating walls in the IC socket housing is also decreased. The length of the contact members is frequently increased to optimize the spring properties. Longer contact members also tend to reduce signal integrity and increase contact resistance due to self-heating of power delivering contacts. The thinner insulating walls increase the difficulty of molding and increase latent stresses in the IC socket housing, increasing the risk of warpage during solder reflow. The thinner insulating walls also increase the risk of cross-talk between adjacent contact members.

Traditional IC sockets have reached an electrical performance limit. Next generation IC devices will operate above 5 GHz and beyond and the existing IC sockets do not provide acceptable performance levels without significant revision.

BRIEF SUMMARY OF THE INVENTION

The present disclosure is directed to a surface mount LGA device socket that will enable next generation electrical performance. The present solution mimics the mechanical details of a simple beam structure made of traditional materials, and removes the normal retention features that add parasitic mass and distort or degrade the integrity of the signal as it passes through the contact. This approach provides a reliable connection to LGA devices and creates a platform to add electrical and mechanical enhancements to the socket substrate or assembly to address the challenges of next generation interconnect requirements.

In general terms, the contact members are inserted into openings in the socket substrate by conventional means. No contact retention features are required, greatly reducing the complexity of the component and the tooling required to produce them. The socket substrate containing the contact members is then inverted to expose the terminal that will connect to the printed circuit board during final assembly. This surface of the socket substrate and exposed contact members are treated as a field of connection points to provide contact retention, to add circuit features not normally embedded within sockets, to add mechanical features that improve the reliability of the solder joint to the PCA, and to provide a platform for passive and active circuit features that improve electrical performance or internal function and intelligence.

The present disclosure merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present disclosure includes adding a bulk material to create the vias and other circuit geometry to supplement or replace the traditional circuit production techniques. This approach enables the production of very small low resistance vias to increase density and reduce line and feature pitch of the circuits as well as a host of electrical enhancements that provide an electrical interconnect that may prove to be superior to the traditional methods.

The present high performance electrical interconnect can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present high performance electrical interconnect can be produced digitally, without tooling or costly artwork. The high performance electrical interconnect can be produced as a "Green" product, with dramatic reductions in environmental issues related to the production of conventional flexible circuits.

The vias and associated circuit geometry can be printed in a variety of shapes and sizes, depending on the terminal structure on the circuit members. The contact members and vias can be positioned at a variety of locations, heights, or spacing to match the parameters of existing connections.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The circuit geometry preferably has conductive traces that have substantially rectangular cross-sectional shapes, corresponding to the recesses. The use of additive printing processes permits conductive material, non-conductive material, and semi-conductive material to be located on a single layer.

In one embodiment, pre-formed conductive trace materials are located in the recesses. The recesses are than plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

At least one electrical device is optionally printed on a dielectric layer and electrically coupled to at least a portion of the circuit geometry. Optical quality materials can be printed or deposited in at least a portion of the recesses to form optical circuit geometries. Alternatively, optical fibers can be located in the recesses.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

In one embodiment the electrical interconnect includes a socket substrate having a first surface with a plurality of first openings having first cross-sections, a second surface with a plurality of second openings having second cross-sections, and center openings connecting the first and second openings. The center openings include at least one cross-section greater than the first and second cross-sections. A plurality of contact members are located in the socket substrate such that first contact tips are located proximate the first openings, second contact tips are located proximate the second openings, and center portions located in the center openings. The center portions include a shape adapted to promote flexure of the contact members within the center openings. First sleeves are attached to the first contact tips. The first sleeves are adapted to slide in the first openings generally along axes generally perpendicular to the first surface as the center portions of the contact members flex in the center openings. Second sleeves are attached to the second contact tips. The second sleeves are adapted to fit in the second openings.

In one embodiment, the second sleeves are adapted to slide in the second openings generally along axes generally perpendicular to the second surface as the center portions of the contact members flex in the center openings. Alternatively, the second sleeves are secured in the second openings.

Solder balls are optionally attached to the second contact tips. The solder balls are adapted to electrically and mechanically couple the electrical interconnect to the PCB.

The contact members optionally include a plurality of beams secured together by the first and second sleeves. Flexure members are optionally located in the center openings adapted to promote flexure of the center portions of the contact members. The flexure members can be secured to one of the center portions of the contact members or the socket substrate. The center portions of the contact members can also have serpentine shapes.

The shapes of the center portions of the contact members preferably have a cross-section greater than the cross-sections of the first and second openings. The center portions serve to secure the contact members to the socket substrate.

In another embodiment, at least one dielectric layer is printed on one of the first or second surface of the socket substrate to create a plurality recesses. A conductive material and/or optical material can be deposited in at least a portion of the recesses to create circuit geometry. The conductive material can be one of sintered conductive particles or a conductive ink. In one embodiment, the dielectric layers can include at least one additional circuitry plane selected from one of a ground plane, a power plane, an electrical connection to other circuit members, a dielectric layer, or a flexible circuit.

At least one printed device is optionally printed on the socket substrate and electrically coupled to at least one of the contact members. The electrical device can be selected from one of shielding, near device decoupling, capacitors, transistors, resistors, filters, signal or power altering and enhancing devices, memory devices, embedded IC devices, RF antennae, and the like.

The socket substrate is preferably a multi-layered structure. The center openings are preferably non-moldable features with undercuts to secure the contact members.

The present disclosure is also directed to an electrical interconnect assembly. Contact pads on an LGA device are electrically coupled to the first contact tips of the contact members. A PCB is soldered to the second contact tips located at the second surface of the socket substrate.

The present disclosure is also directed to a method of making a surface mount electrical interconnect adapted to provide an interface between contact pads on an LGA device and a PCB. The method includes forming a socket substrate with a first surface having a plurality of first openings with first cross-sections, a second surface with a plurality of second openings having second cross-sections, and center openings connecting the first and second openings. The center openings include at least one cross-section greater than the first and second cross-sections. A plurality of contact members is located in the socket substrate. The contact members include first contact tips located proximate the first openings, second contact tips located proximate the second openings, and center portions located in the center openings. The center portions include a shape adapted to promote flexure of the contact members within the center openings. First sleeves attached to the first contact tips are located in the first openings. The first sleeves are adapted to slide generally along axes generally perpendicular to the first surface as the center portions of the contact members flex in the center openings. Second sleeves attached to the second contact tips are located in the second openings.

In one embodiment, the second sleeves are permitted to slide in the second openings generally along axes generally perpendicular to the second surface as the center portions of the contact members flex in the center openings. Alternatively, the second sleeves are attached in the second openings.

Flexure members are optionally located in the center openings to promote flexure of the center portions of the contact members. The center portions of the contact members preferably have a cross-section greater than the cross-sections of the first and second openings.

In another embodiment, at least one electrical device is printed on the socket substrate and electrically coupled to at least a one of the contact members.

BRIEF DESCRIPTION OF THE SEVERAL VIEWS OF THE DRAWING

FIGS. 1A and 1B illustrate an electrical interconnect in accordance with an embodiment of the present disclosure.

FIG. 6 is a sectional view of an electrical interconnect with serpentine contact members in accordance with an embodiment of the present disclosure.

DETAILED DESCRIPTION OF THE INVENTION

Figure 2:
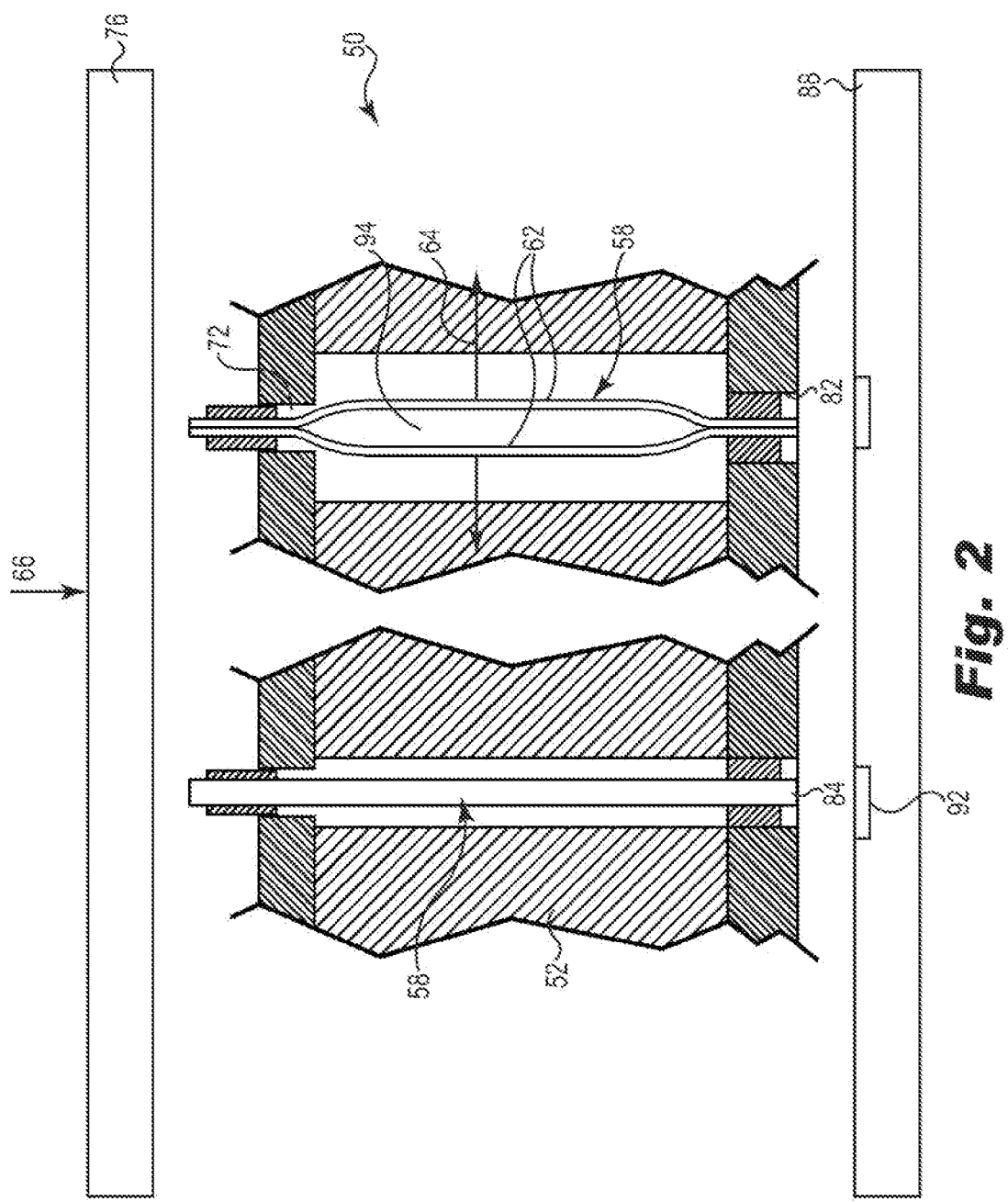
FIG. 2 is a sectional view of an electrical interconnect adapted to coupled with two LGA devices in accordance with an embodiment of the present disclosure.

A high performance electrical interconnect according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance electrical interconnects are especially useful for communications, wireless, and memory devices.

The present high performance electrical interconnect can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

FIGS. 1A and 1B illustrate an electrical interconnect 50 in accordance with an embodiment of the present disclosure. Socket substrate 52 is typically includes multiple layers 54A, 54B, 54C ("54") that creates undercuts 56 that capture contact member 58 in center opening 60. The layers 54 also permit the creation of internal features, undercuts, or cavities that are difficult or typically not possible to make using conventional molding or machining techniques, referred to herein as a "non-moldable feature." In one embodiment, the layers 54 are be discrete structures laminated or bonded together. Alternatively, the socket substrate 52 is formed as a series of sequentially printed layers 54. As used herein, "bond" or "bonding" refers to, for example, adhesive bonding, solvent bonding, ultrasonic welding, thermal bonding, or any other techniques suitable for attaching adjacent layers to a substrate.

In the illustrated embodiment, the contact member 58 includes a pair of opposing beams 62A, 62B ("62") shaped to flex in outward directions 64 in response to axial force 66. The size of the center openings 60 can be adjusted to control the total flexure of the beams 62 in the outward directions 64, and hence, the total vertical displacement of the contact tips 68 relative to the layer 54A. The beams 62 are constructed from a conductive material, such as for example BeCu or equivalent.

Upper ends 74 of the beams 62 are joined together by upper sleeve 70A sized to slide freely in upper opening 72 in layer 54A. FIG. 1A illustrates a top view of layer 54A with an array of upper openings 72 in accordance with an embodiment of the present disclosure. The upper sleeve 70A preferably stops short of contact tips 68 to provide connection points to LGA device 76, but has an overall length that prevents the sleeve 70A from catching on the undercut 56. The upper sleeve 70A is preferably a plastic structure that is molded or deposited onto distal ends 74. In one embodiment, the contact members 58 are manufactured as an array or leadframe structure to fix the relative positioning of adjacent contact members 58.

Lower ends 80 of the beams 62 are joined by lower sleeve 70B. The lower sleeve 70B stops short of the contact tips 84 to electrically couple with solder balls 86. In one embodiment the lower sleeve 70B secured to the layer 54C, such as by friction, interference fit, bonding, welding, and the like. The width of the opening 82 in the layer 54C can optionally be sized in the narrow direction to keep the lower sleeve 70B from entering the center opening 60. In one embodiment, the lower sleeve 70B can have a flat spot on one side to key the orientation of the contact member 58 relative to the socket substrate 52. The contact member 58 is preferably inserted through the lower opening 82 and the lower sleeve 70B seals the layer 54C to prevent solder 86 from wicking into the center opening 60. The sizes of the sleeves 70A, 70B ("70"), the openings 60, 72, 82 may vary depending on the terminal pitch and the amount of beam deflection required.

In one embodiment, reflowing the solder balls 86 electrically and mechanically attaches the electrical interconnect 50 to the PCB 88. Alternatively, the contact tips 84 can be left exposed to electrically couple with LGA pads on the PCB 88 (see e.g., FIG. 2).

The operation of the present electrical interconnect 50 relates to bowing or buckling beam action as the upper LGA device 76 applies a load 66 to the contact tips 68. The sleeves 70 maintain position of the contact tips 68, 84 relative to each other and force the central beams 62 to bow in direction 64. The use of dual opposing beams 62 provides a balanced loading effect. The generally constant cross section of the beams 62 improves signal integrity and impedance matching. The opposing beams 62 support each other, which permits narrower beam cross sections, while a single beam of the same dimension would likely experience plastic deformation and collapse under load 66. The sleeves 70 control displacement and guide the contact tips 68 during vertical translation. The sleeves 70 also prevent the contact tips 68, 84 from lateral translation that could result in misalignment with the LGA device 76 or PCB 88. The upper sleeve 70A has an overall length that prevents it from being captured by the undercut 56 and not returning to its original position after the load 66 is removed.

In another embodiment, layer 54A translates relative to the layer 54B to create a normally closed or zero insertion force version of the present electrical interconnect 50. In particular, as the LGA device 76 engages with the surface 90 of the layer 54A, the layer 54A moves toward the layer 54B, the contact tips 68 extend from the upper openings 72 to engage with the LGA device 76. When the load 66 is removed, the layer 54A moves away from the layer 54B and the contact tips 68 retract back into the upper openings 72.

It will be appreciated that the present electrical interconnect can be used to connect a wide variety of circuit members, such as for example, packaged integrated circuits, unpackaged integrated circuits, printed circuit boards, flexible circuits, bare-die devices, organic or inorganic substrates, or any other device capable of carrying electrical current.

FIG. 2 illustrates a variation of the electrical interconnect 50 of FIG. 1 where the lower contact tips 84 are left exposed. In one embodiment, the lower tips 84 are preloaded to the pads 92 on the PCB 88. Consequently, the contact members 58 can have a live signal during engagement with the LGA device 76.

In another embodiment, the upper and lower sleeves 70 are both permitted to slide in their respective openings 72, 82. During engagement of the contact members 58 with the LGA device 76 and the PCB 88 the beams 62 bow outward in direction 64 to balance the load 66. The gap 94 between the beams 62 is preferably larger than the openings 72, 82 to prevent the contact members 58 from falling out of the substrate 52.

Figure 3:
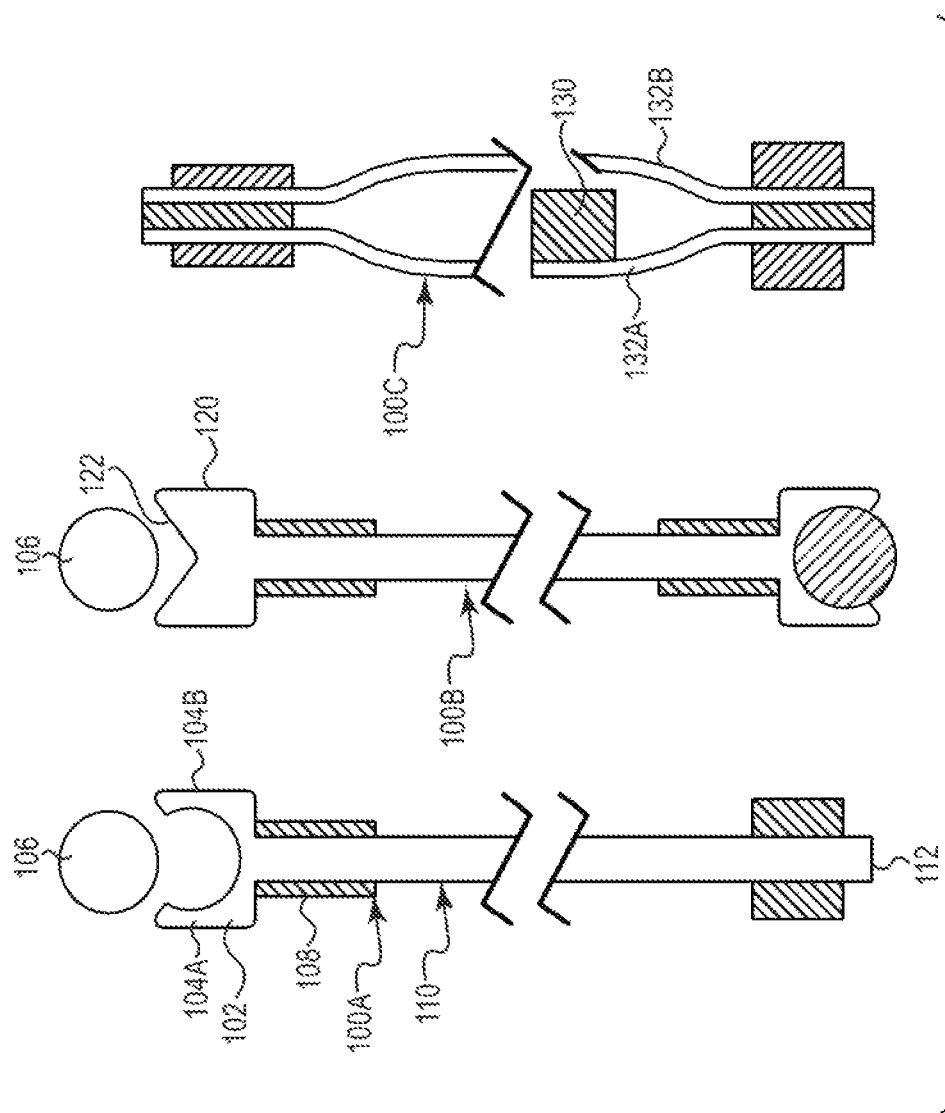
FIG. 3 illustrate various contact members suitable for use in an electrical interconnect in accordance with an embodiment of the present disclosure.

FIG. 3 illustrates various contact members 100A, 100B, 100C ("100") suitable for use in an electrical interconnect in accordance with an embodiment of the present disclosure. Upper contact tip 102 on contact member 100A includes a pair of arms 104A, 104B configures to mechanically engage with a solder ball 106 on a BGA device (not shown). In addition to sliding in an opening of the socket substrate (see e.g., FIG. 1B), sleeve 108 serves to secure the beams 110 of the contact member 100A and to reinforce the upper contact tip 102. Lower contact tip 112 is configured for engagement with an LGA device as illustrated in FIG. 2.

Upper contact tip 120 of the contact member 100B is shaped to receive a solder ball 106 on a BGA device, without the mechanically coupling feature of the contact tip 102. The V-shaped recess 122 serves to center the solder ball 106 relative to the upper contact tip 120.

Contact member 100C includes flexure members 130, preferably attached to one of the beams 132A, 132B ("132"). See e.g., FIG. 4. The flexure members 130 are bonded or printed near the center of one of the beams 132. When the beams 132 are merged, the interference of the flexure members 130 spread the beams 132 to provide a natural tendency for the beams 132 to flex outward during actuation. The flexure members 130 eliminate the need to pre-form the beams 132.

Figure 4:
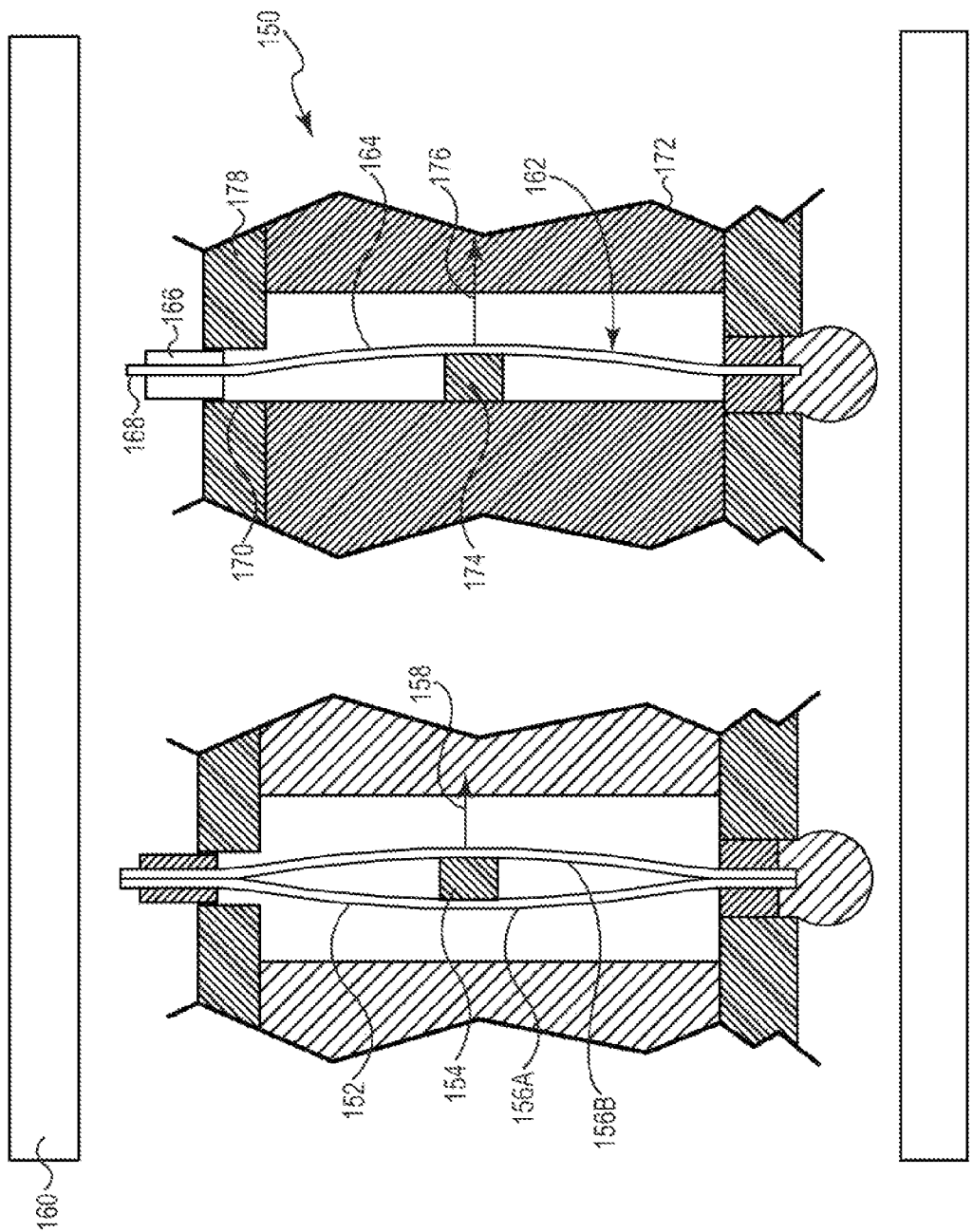
FIG. 4 is a sectional view of an electrical interconnect with bowing members in accordance with an embodiment of the present disclosure.

FIG. 4 illustrates an alternate electrical interconnect 150 in accordance with an embodiment of the present disclosure. Contact member 152 includes flexure members 154 located between the beams 156A, 156B ("156") to induce bowing in direction 158 during actuation by LGA device 160, as discussed above.

Contact member 162 is a single beam configuration in accordance with an embodiment of the present disclosure. Almost any vertical shape or cross section is possible. The contact member 162 is essentially a flat beam 164. Upper sleeve 166 guides the upper contact tip 168 in opening 170 of the socket substrate 172. Flexure members 174 are optionally positioned to engage the beam 164 to induce flexure in the desired direction 176. The flexure members 174 can be attached to the beam 164 or the socket substrate 172. In an alternate embodiment, discussed above, layer 178 optionally translates relative to the socket substrate 172 to induce flexure of the beam 164, without interference or in a zero insertion force configuration.

Figure 5B:
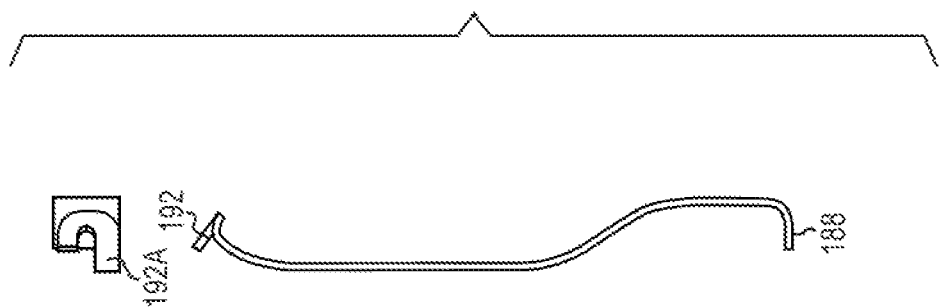
FIGS. 5A and 5B illustrate an alternate contact member for using in an electrical interconnect in accordance with an embodiment of the present disclosure.
Figure 5A:
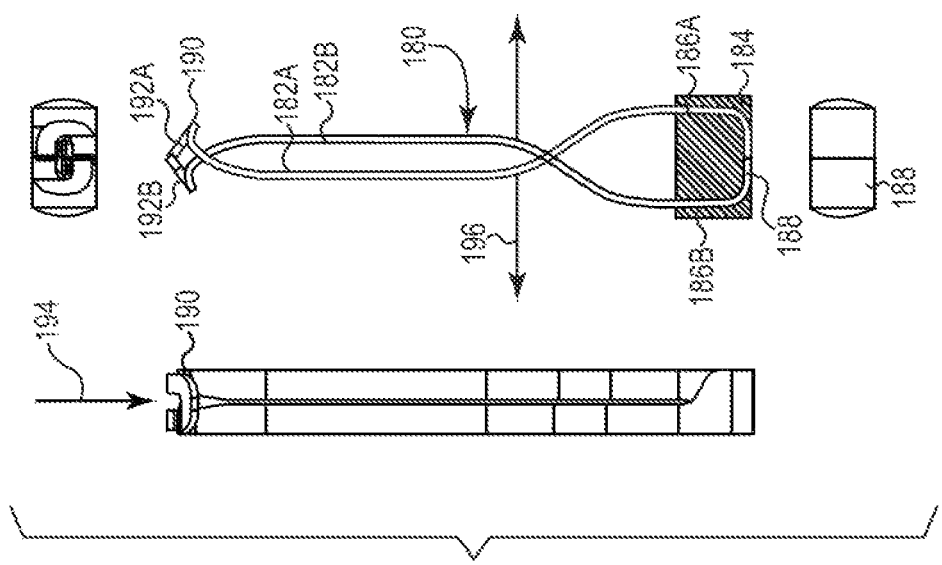

FIG. 5A illustrates various view of an alternate dual beam contact member 180 in accordance with an embodiment of the present disclosure. Beams 182A, 182B ("182") are secured together by sleeve 184 molded to lower ends 186A, 186B in a manner to leave lower contact tips 188 exposed. FIG. 5B illustrates a single one of the beams 182.

Upper contact tips 190 include overlapping tabs 192A, 192B ("192") that lock the beams 182 together, making an upper sleeve unnecessary. Compressive force 194 on the upper contact tips 190 from an LGA device (not shown) causes the beams 182 to flex in outward direction 196, while the tabs 192 keep the contact tips 190 locked together.

FIG. 6 illustrates an alternate electrical interconnect 200 with a serpentine contact member 202 in accordance with an embodiment of the present disclosure. The contact member 202 includes a plurality of bends 204A, 204B ("204") that permit flexure in a plurality of directions 206A, 206B ("206"). Sidewalls 208 of the center opening 210 in the socket substrate 212 limit the displacement of the bends 204.

Figure 7:
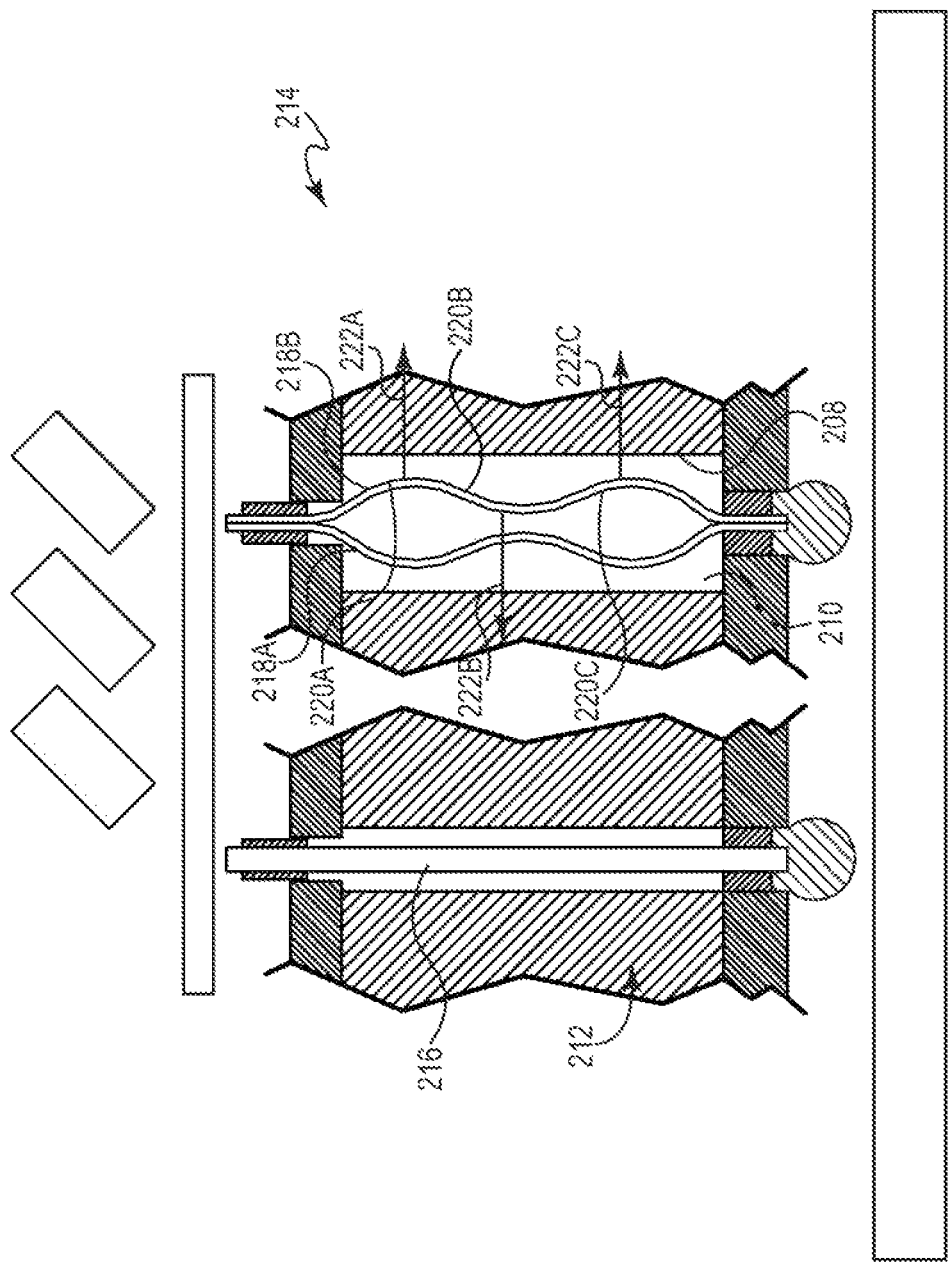
FIG. 7 is a sectional view of an electrical interconnect with alternate serpentine contact members in accordance with an embodiment of the present disclosure.

FIG. 7 illustrates an alternate electrical interconnect 214 with dual beam contact members 216 with serpentine shapes in accordance with an embodiment of the present disclosure. Each beam 218A, 218B ("218") includes a plurality of bends 220A, 220B, 220C ("220") that permit flexure in a plurality of directions 222A, 222B, 222C ("222"). In the illustrated embodiment, the beams 218 are mirror images of each other so only the beam 218B is labeled. Sidewalls 208 of the center opening 210 in the socket substrate 212 limit the displacement of the bends 220. In one embodiment, the beams 218 may engage with each other at bends 220B.

Figure 8:
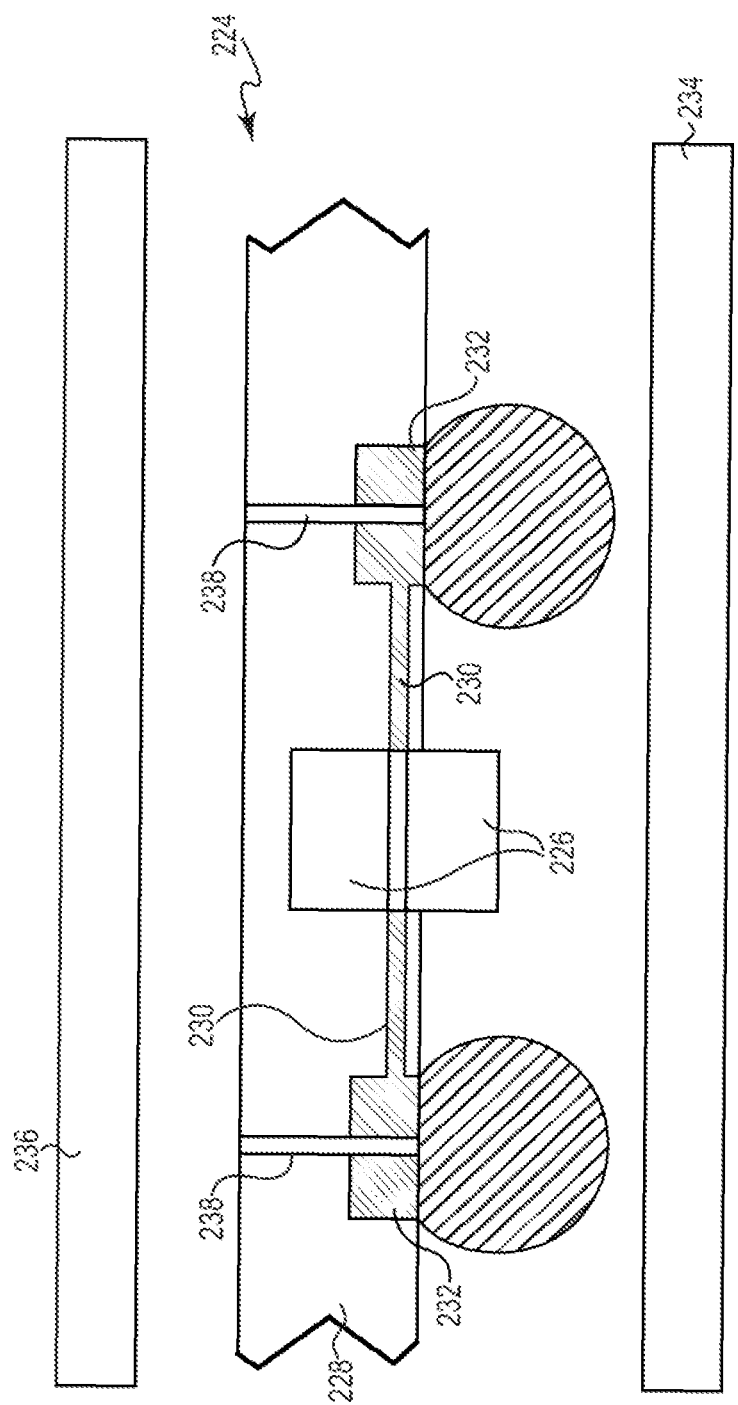
FIG. 8 illustrates an electrical interconnect with on-board electrical devices in accordance with an embodiment of the present disclosure.

FIG. 8 illustrates electrical interconnect 224 with electrical devices 226, such as for example, internal decoupling capacitors, located on socket substrate 228 in accordance with an embodiment of the present disclosure. Printed conductive traces 230 electrically couple the electrical devices 226 to one or more of the contact pads 232. Openings 238 are adapted to receive any of the contact members discussed above.

The electrical devices 226 can be added as discrete components or printed materials, reducing the need for discrete components on the PCB 234 and the integrated circuit device 236. Locating the electrical devices 226 in the socket substrate 220 permits integrated circuit manufactures to reduce or eliminate the capacitors currently located on the package 236 and printed circuit board 234. This shift can greatly reduce cost and simplify the package 236 and printed circuit board 234, while improving performance.

The electrical devices 226 can be a power plane, ground plane, capacitor, resistor, filters, signal or power altering and enhancing device, memory device, embedded IC, RF antennae, and the like. The electrical devices 226 can be located on either surface of the substrate 228, or embedded therein. The electrical devices 226 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 226 on the electrical interconnect 224 improves performance and enables a reduction in the cost of integrated circuit devices and the PCB 234. Integrated circuit manufactures are limited by the pitch that the PCB 234 can accommodate and still keep the printed circuit board to four layers. The integrated circuit makers can manufacture the integrated circuit device 236 with a smaller pitch, but with the pin counts is so high that the printed circuit board 234 likely requires additional layers in order to route all of the signals. The present electrical interconnect 224 also permits integrated circuit manufactures to reduce the pitch of the contacts on the IC device 236, and perform any required signal routing in the electrical interconnect 224, rather than in the printed circuit board 234 or by adding daughter boards to the system.

Figure 9:
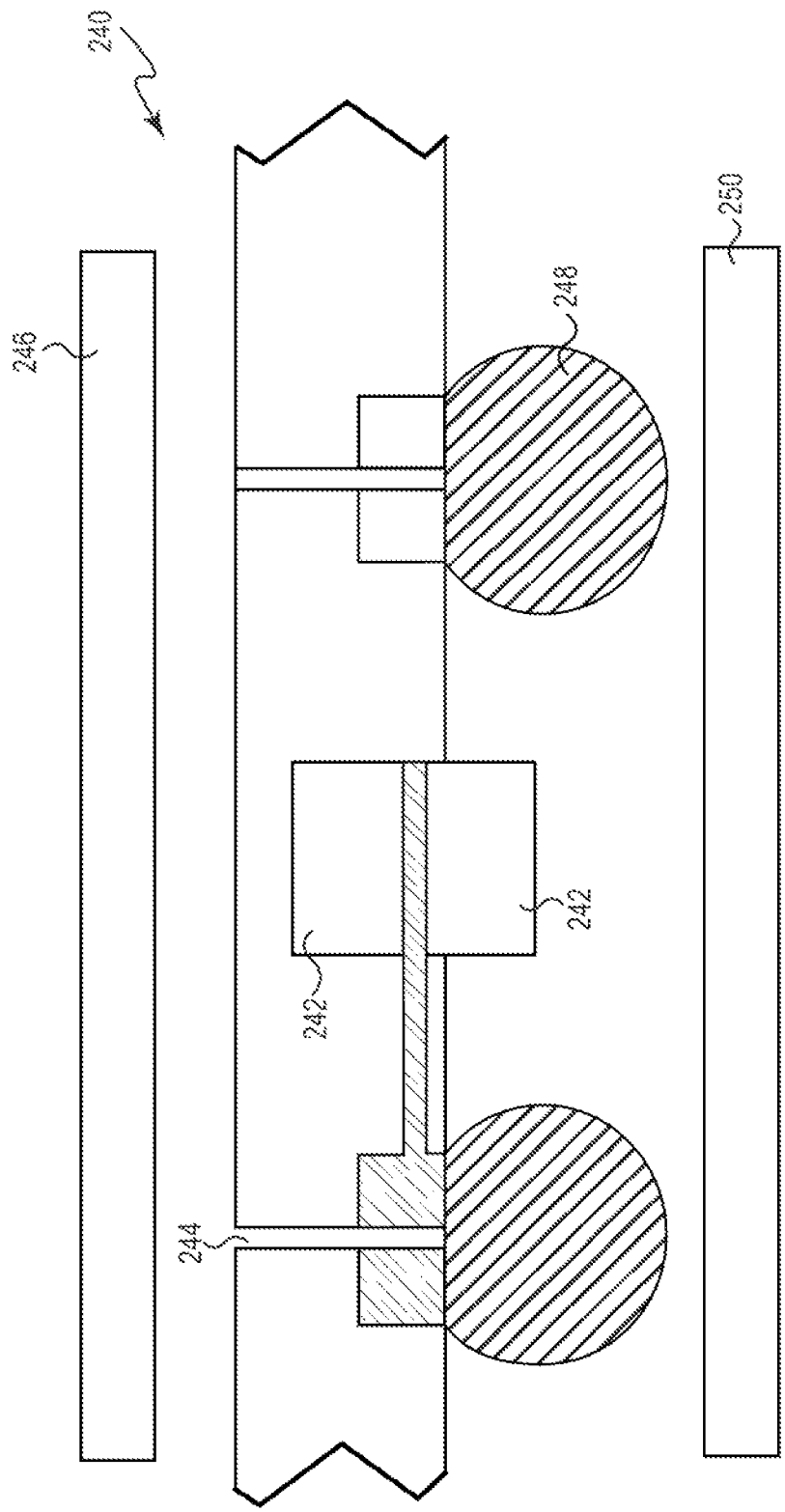
FIG. 9 illustrates an alternate electrical interconnect with on-board electrical devices in accordance with an embodiment of the present disclosure.

FIG. 9 illustrates an alternate electrical interconnect 240 with on-board electrical devices 242 in accordance with an embodiment of the present disclosure. The decoupling capacitance 242 can be a discrete embedded or printed electrical device. Contact member 244 provides the electrical connection to the capacitor located on the semiconductor device 246 and solder ball 248 provides the electrical connection to the capacitor located on printed circuit board 250.

Figure 10:
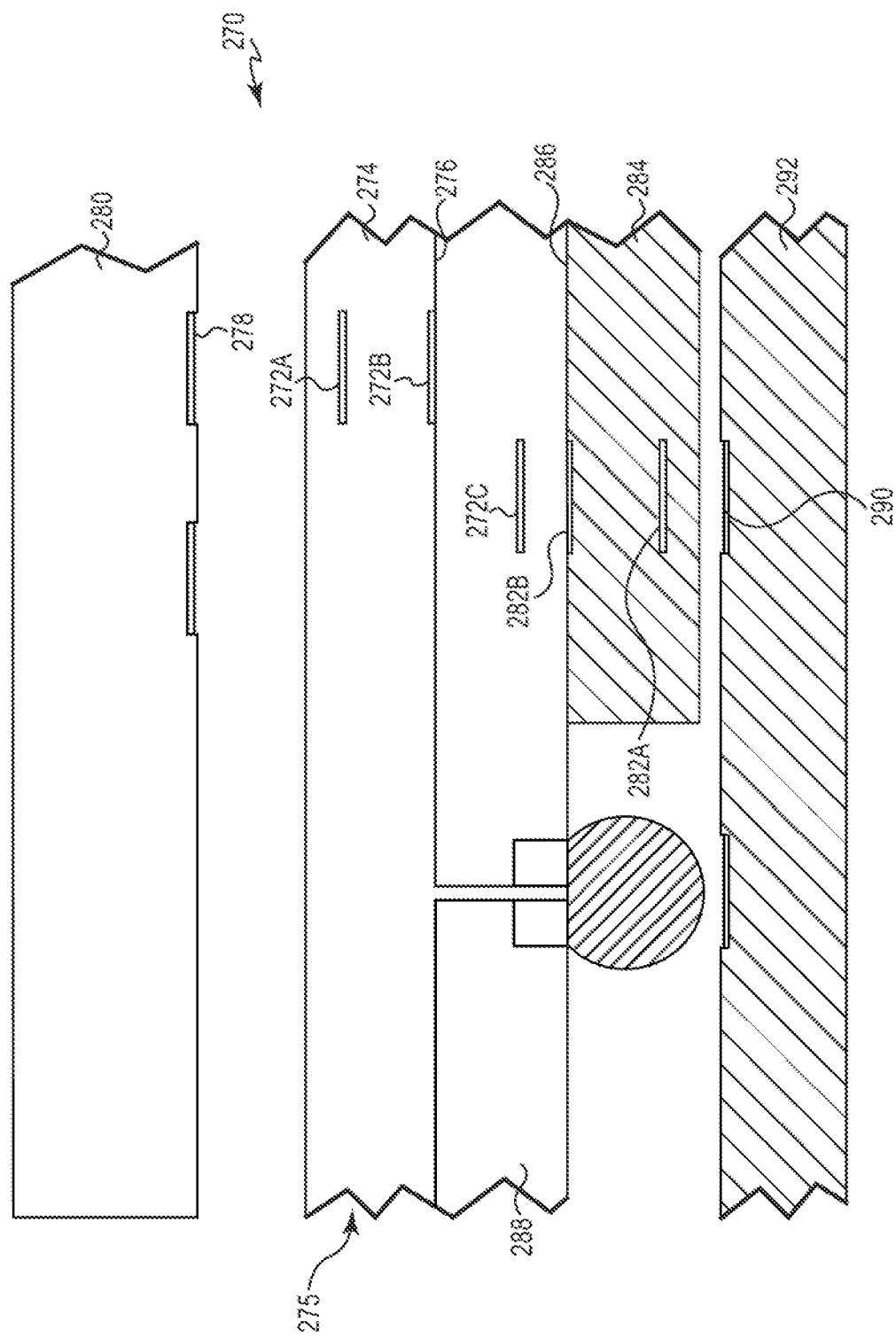
FIG. 10 illustrates an electrical interconnect with capacitive coupling in accordance with an embodiment of the present disclosure.

FIG. 10 is a cross-sectional view of electrical interconnect 270 with various capacitive coupling features in accordance with another embodiment of the present disclosure. A capacitive coupling feature 272A is embedded in layer 274 of the substrate 275. A capacitive coupling feature 272B is located on second surface 276 of the layer 274. The capacitive coupling features 272A, 272B are positioned to electrically couple with contact pad 278 on integrated circuit device 280. The capacitive coupling 272C is embedded in layer 288.

Capacitive coupling feature 282A is embedded in layer 284 of the substrate 275. Capacitive coupling feature 282B is located on first surface 286 of the layer 284. The capacitive coupling feature 282A is positioned to electrically couple with contact pad 290 on the PCB 292. The various capacitive coupling features in the embodiment of FIG. 10 are optionally formed using inkjet printing technology, aerosol printing technology, or other printing technology.

Figure 11:
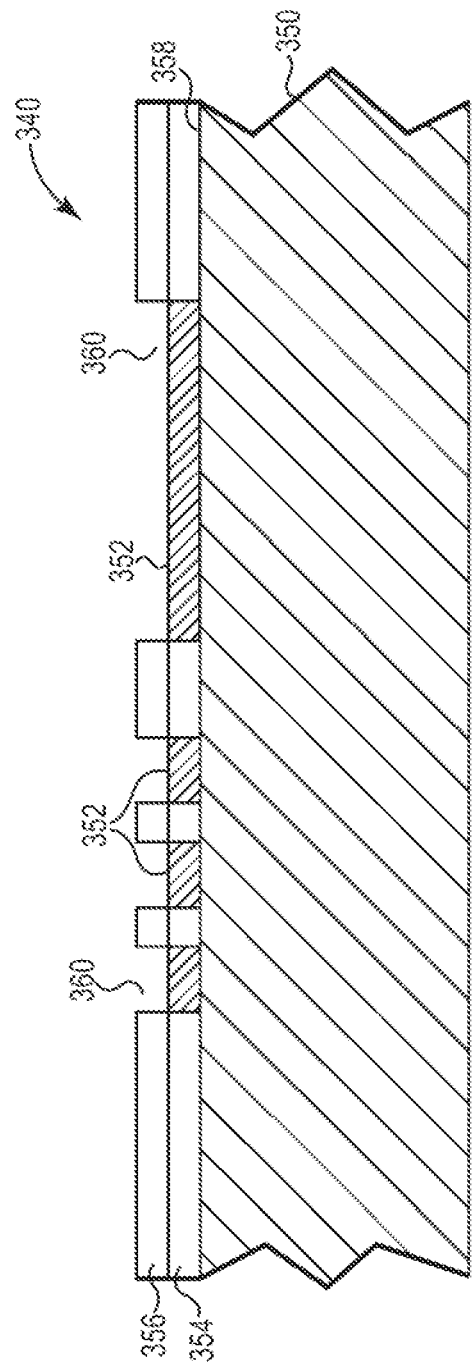
FIG. 11 is a cross-sectional view of a method of making high performance electrical interconnects in accordance with an embodiment of the present disclosure.

FIG. 11 is a cross-sectional view of a method of making an electrical interconnect 340 using additive processes in accordance with an embodiment of the present disclosure. The process starts similar to a traditional PCB with a first circuitry layer 352 laminated to a stiffening layer or core 350, such as glass-reinforced epoxy laminate sheets (e.g., FR4). The first circuitry layer 352 can be preformed or can be formed using a fine line imaging step is conducted to etch the copper foil 352 as done with many PCB processes. One or more dielectric layers 354, 356 are printed or placed to the surface 358 such that the first circuitry layer 352 is at least partially encased and isolated. In some embodiments, it may be desirable to use a preformed dielectric film to leave air dielectric gaps between traces. Recesses 360 in the dielectric layer 356 to expose circuitry 352 can be formed by printing, embossing, imprinting, chemical etching with a printed mask, or a variety of other techniques.

Figure 12:
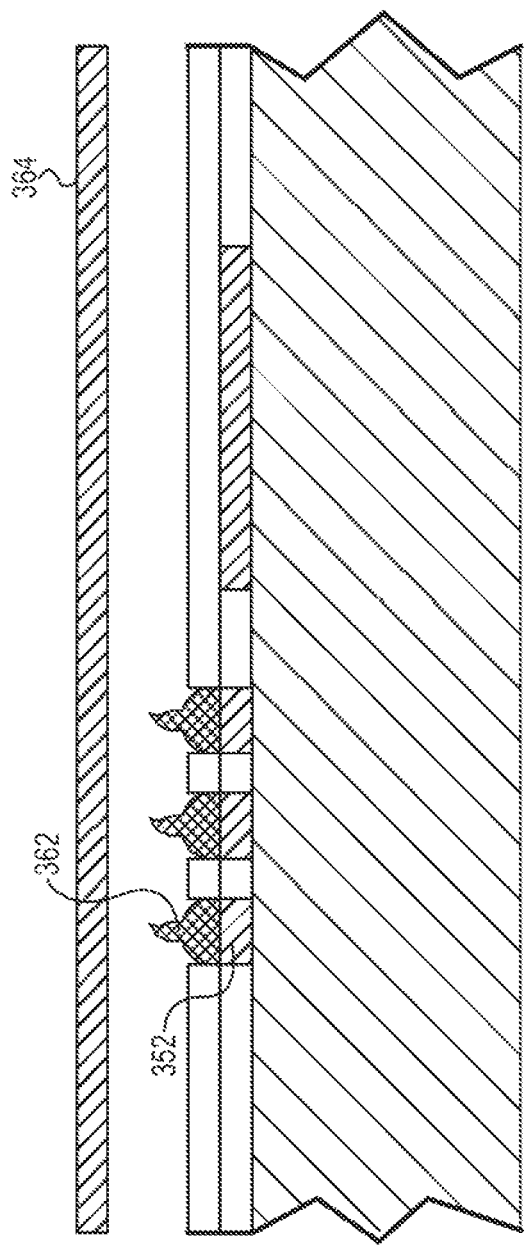
FIG. 12 illustrates via formation on the high performance electrical interconnect of FIG. 11.

As illustrated in FIG. 12, bond points 362, such as for example stud bumps or soldier balls, are added to the exposed circuitry 352 with a traditional bonding machine used in semiconductor packaging applications. Historically, fine gold wire has been used for bonding, with copper seeing increased use in recent years due to the rise in the cost of gold.

Figure 13:
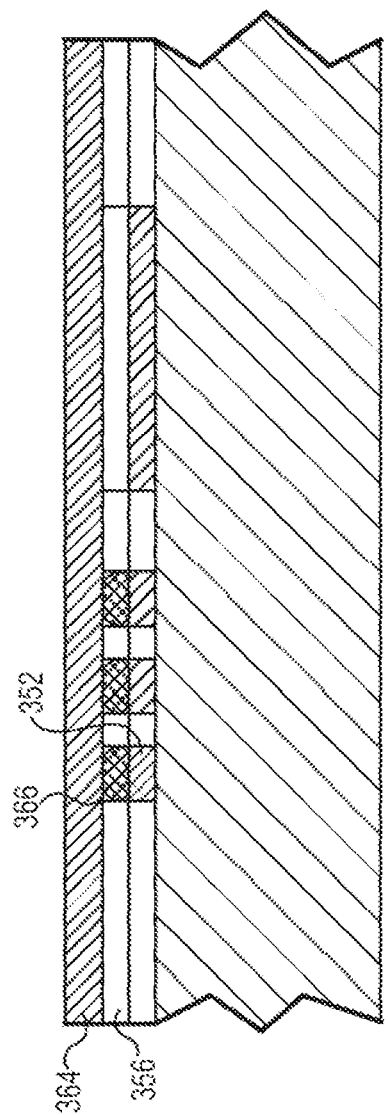
FIG. 13 illustrates application to a second circuitry layer to the high performance electrical interconnect of FIG. 11.

As illustrated in FIG. 13, second circuitry layer 364 is applied to the previous construction such that the bond points 362 are deformed to create the interconnecting vias 366 during the lamination operation. The size and shape of the bond points 362 can be tailored to the ideal condition for deformation without piercing the foil 364.

The second circuitry layer 364 can be pre-etched with the next circuit pattern or can be laminated as a sheet and etched post lamination. In addition, the dielectric material 356 can be left in a tack cure or partial cure state such that a final bond is achieved at final cure. If desired, the bond bumps 362 can be coined planar prior to adding the second circuitry layer 364.

Figure 14:
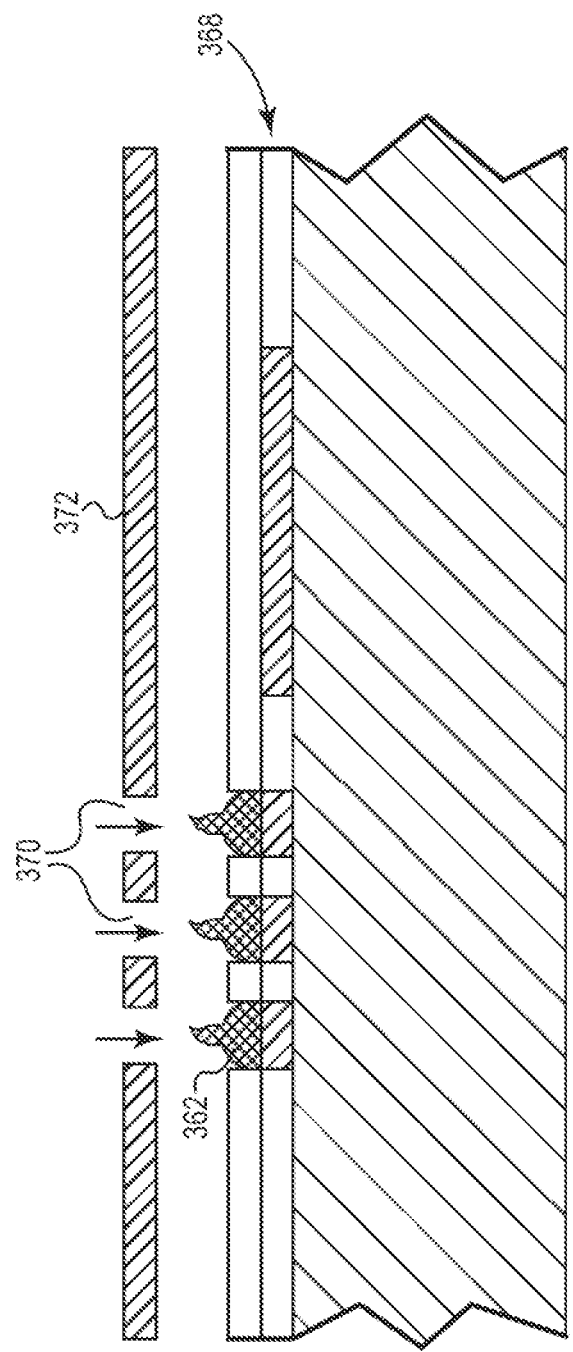
FIG. 14 illustrates an alternate method of making an electrical interconnect in accordance with an embodiment of the present disclosure.
Figure 15:
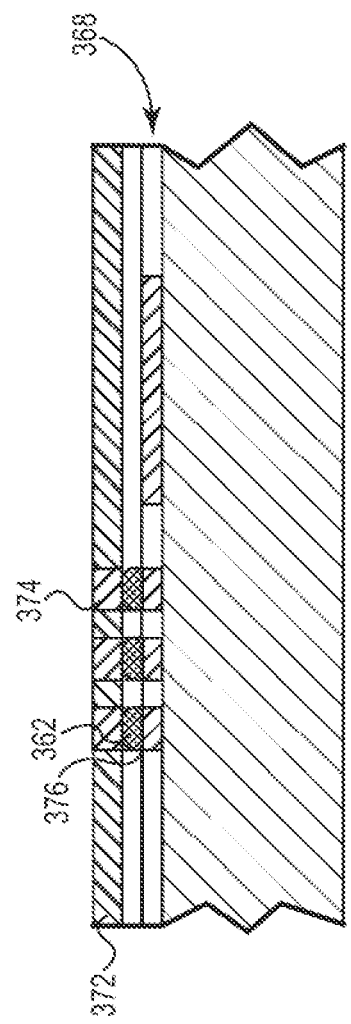
FIG. 15 illustrates application of a second circuitry layer to the electrical interconnect of FIG. 14.

FIGS. 14 and 15 illustrate an alternate interconnect 368 with preformed holes or breaks 370 in the first circuitry layer 372 in accordance with an embodiment of the present disclosure. The holes 370 permit the bond points 362 to extend into the openings 370 or reside near the openings 370 so plating solution 374 can enter the mating region to plate the via structure 376 together. The plating 374 is preferably a corrosion resistant metallic material such as nickel, gold, silver, palladium, or multiple layers thereof. One benefit of the present structure is the material set can be varied layer by layer or altered on a given layer to create some desired performance enhancement not possible with conventional construction.

Figure 16:
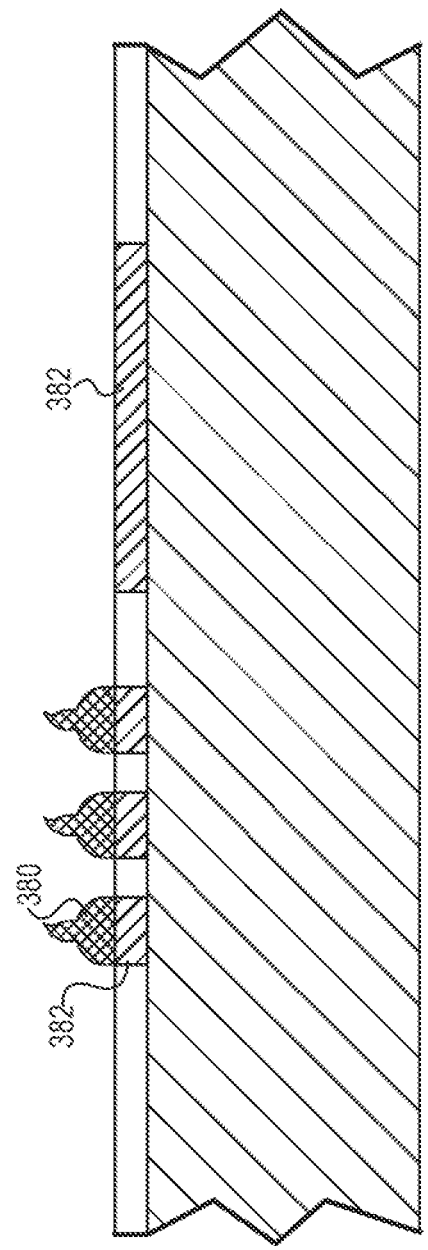
FIG. 16 illustrates another method of making an electrical interconnect in accordance with an embodiment of the present disclosure.
Figure 17:
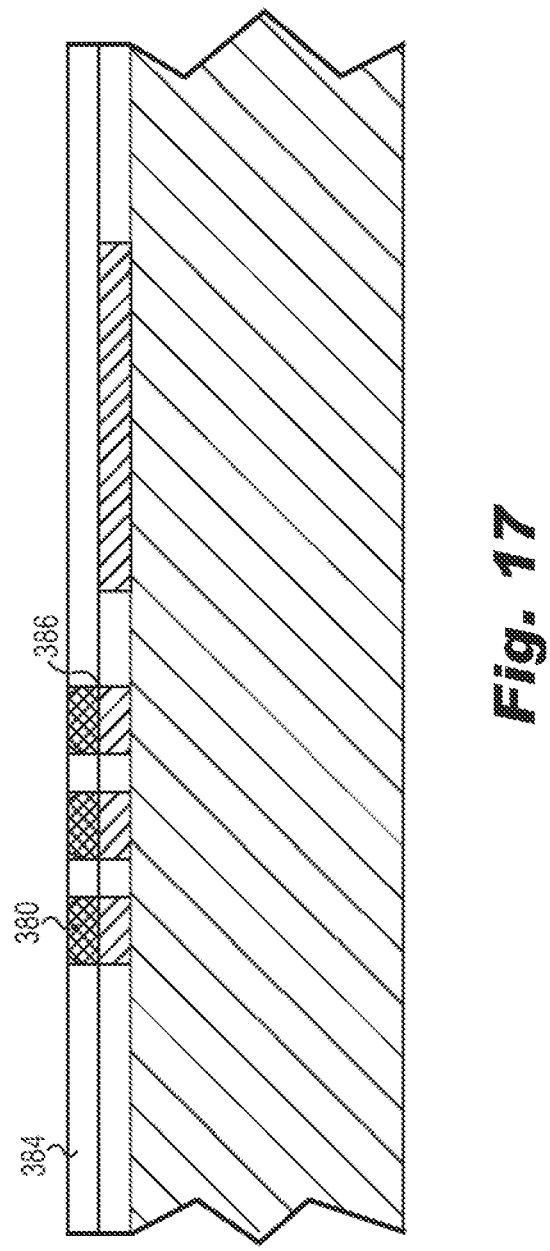
FIG. 17 illustrates via formation on the electrical interconnect of FIG. 16.

FIGS. 16 and 17 illustrate an alternate construction in which bond points 380 are added to the circuitry 382 while it is planar, without upper dielectric layer 384 to provide clearance for the bonding tool to impact the circuitry 382 without encountering or damaging the dielectric 384. The bond points 380 can be coined en masse to planarize them either before or after the dielectric layer 384. In one embodiment, the dielectric layer 384 is added with the bond points 380 in place and then imaged to expose the vias 386 for subsequent application of the next pre-etched circuit layer to be placed and plated together (see e.g., FIGS. 12 and 14). The dielectric layer 384 can optionally be filled or doped with a near endless list of enhancement materials to lower dielectric constant, provide thermal management properties, create rigid, flexible, or compliant regions etc.

Figure 18:
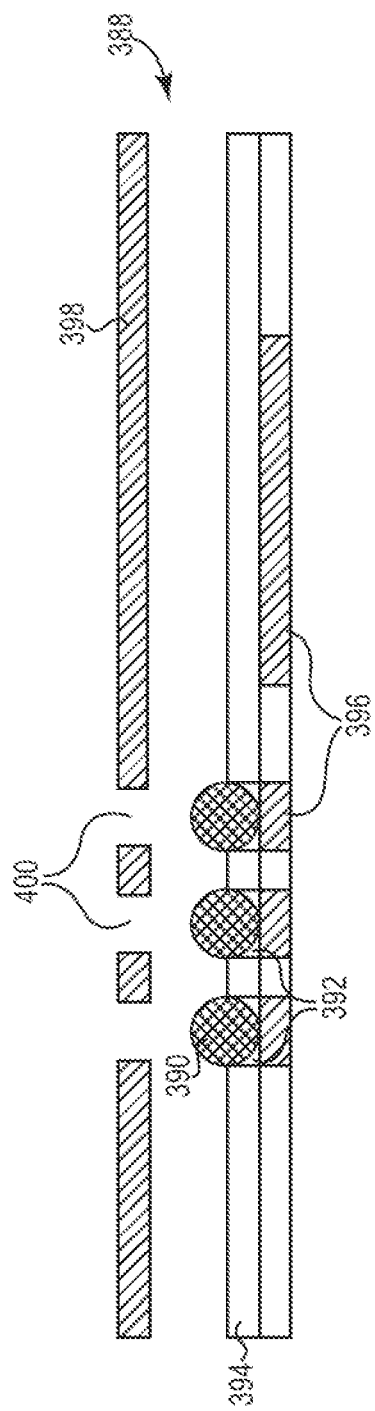
FIG. 18 illustrates an electrical interconnect with bulk metal deposited in recesses to form the vias in accordance with an embodiment of the present disclosure.

FIG. 18 illustrates an alternate electrical interconnect 388 with solid bulk metal 390, such as copper or solder spheres, or plated copper, located in recesses 392 in dielectric layer 394 in accordance with an embodiment of the present disclosure. The bulk metal 390 electrically couples with the lower circuitry layer 396 and the upper circuitry layer 398 with slight deformation or material displacement. In one embodiment, the bulk metal 390 is plated, such as by flowing a plating solution through openings 400 in the upper circuitry 398. It may be possible to provide sufficient engagement to interconnect reliably without the need for plating since the bulk metal 390 is encased within dielectric 394 and environmentally sealed. In the event the bulk metal 390 is solder, the circuit layers 396, 398 can be interconnected when the solder 390 is reflowed with the dielectric 394 acting as a natural solder wicking barrier.

Figure 19:
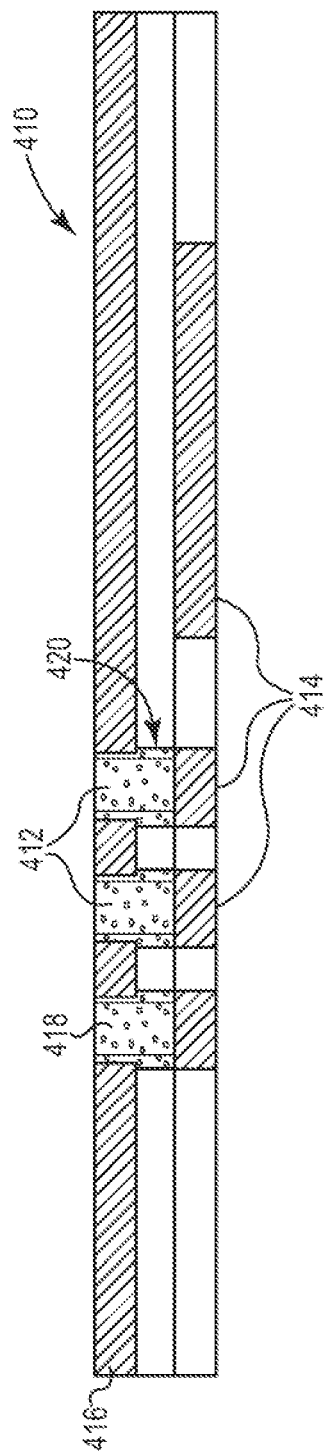
FIG. 19 illustrates an electrical interconnect with recesses filed with conductive particles as the vias in accordance with an embodiment of the present disclosure.

FIG. 19 illustrates an alternate electrical interconnect 410 with reservoirs 412 between circuitry layers 414, 416 that can be filled with loose conductive particles 418 in accordance with an embodiment of the present disclosure. The conductive particles 418 can optionally be sintered, coined, tightly compacted, plated, mixed with an adhesive binder, etc. to create via 420. The method of FIG. 19 can also be used to create the circuitry itself or supplement the etched foil structures. Use of reservoirs containing conductive particles is disclosed in commonly assigned PCT/US2010/36313 entitled Resilient Conductive Electrical Interconnect, filed May 27, 2010, which is hereby incorporated by reference.

Figure 20:
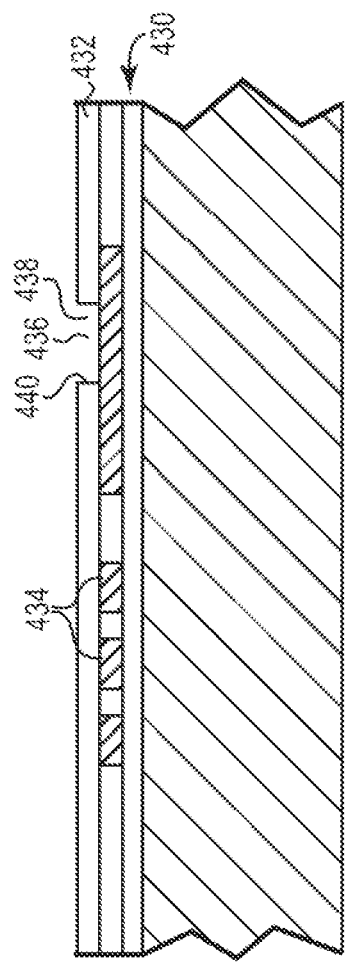
FIG. 20 is a side sectional view of an electrical interconnect in accordance with an embodiment of the present disclosure.

FIG. 20 illustrates an alternate electrical interconnect 430 with an insulating layer 432 applied to the circuit geometry 434. The nature of the printing process allows for selective application of dielectric layer 432 to leave selected portions 436 of the circuit geometry 434 expose if desired. The resulting high performance electrical interconnect 430 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 21:
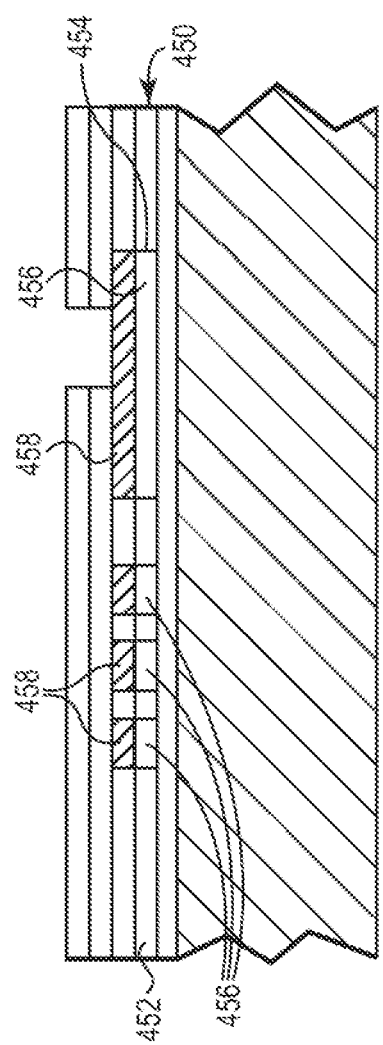
FIG. 21 is a side sectional view of an alternate electrical interconnect with printed compliant material in accordance with an embodiment of the present disclosure.

FIG. 21 illustrates an alternate high performance electrical interconnect 450 in accordance with an embodiment of the present disclosure. Dielectric layer 452 includes openings 454 into which compliant material 456 is printed before formation of circuit geometry 458. The compliant printed material 456 improves reliability during flexure of the electrical interconnect 450.

Figure 22:
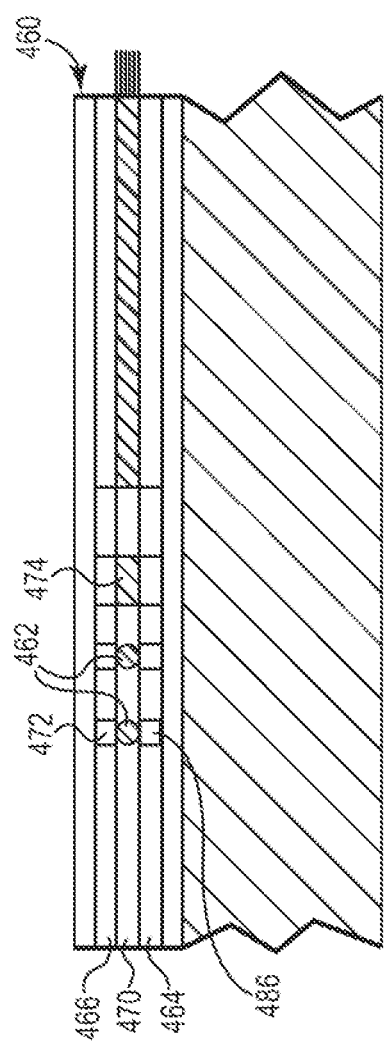
FIG. 22 illustrates an electrical interconnect with optical features in accordance with an embodiment of the present disclosure.

FIG. 22 illustrates an alternate high performance electrical interconnect 460 in accordance with an embodiment of the present disclosure. Optical fibers 462 are located between layers 464, 466 of dielectric material. In one embodiment, optical fibers 462 are positioned over printed compliant layer 468, and dielectric layer 470 is printed over and around the optical fibers 462. A compliant layer 472 is preferably printed above the optical fiber 462 as well. The compliant layers 468, 472 support the optical fibers 462 during flexure. In another embodiment, the dielectric layer 470 is formed or printed with recesses into which the optical fibers 462 are deposited.

In another embodiment, optical quality materials 474 are printed during printing of the high performance electrical interconnect 460. The optical quality material 474 and/or the optical fibers 462 comprise optical circuit geometries. The printing process allows for deposition of coatings in-situ that enhances the optical transmission or reduces loss. The precision of the printing process reduces misalignment issues when the optical materials 474 are optically coupled with another optical structure.

Figure 23:
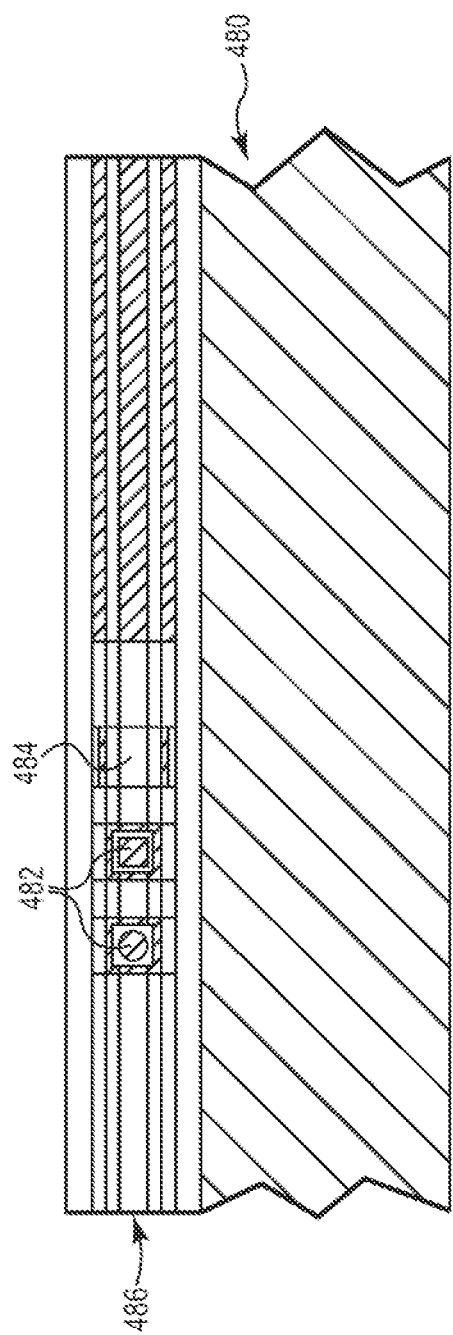
FIG. 23 illustrates an alternate high performance electrical interconnect with optical features in accordance with an embodiment of the present disclosure.

FIG. 23 illustrates another embodiment of a present high performance electrical interconnect 480 in accordance with an embodiment of the present disclosure. Embedded coaxial RF circuits 482 or printed micro strip RF circuits 484 are located with dielectric/metal layers 486. These RF circuits 482, 484 are preferably created by printing dielectrics and metallization geometry.

Figure 24:
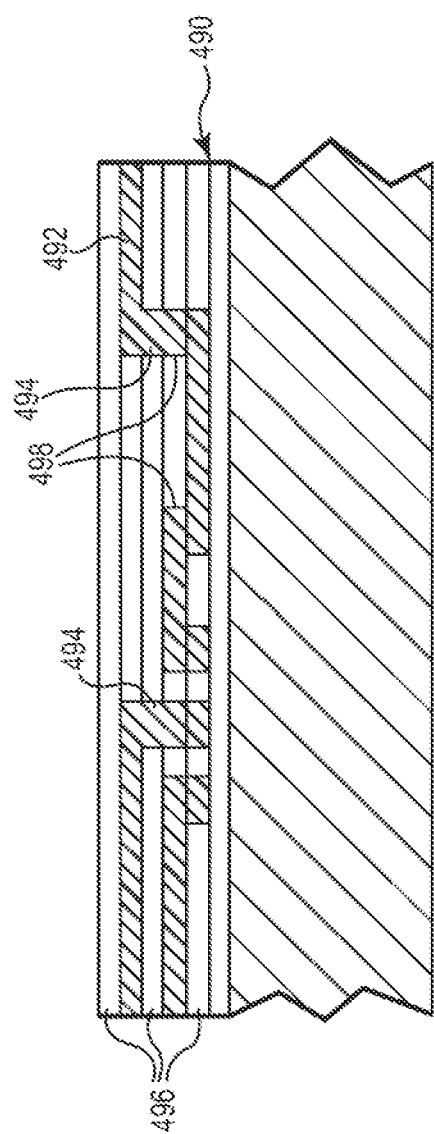
FIG. 24 illustrates an alternate high performance electrical interconnect with printed vias in accordance with an embodiment of the present disclosure.

As illustrated in FIG. 24, use of additive processes allows the creation of a high performance electrical interconnect 490 with inter-circuit, 3D lattice structures 492 having intricate routing schemes. Vias 494 can be printed with each layer, without drilling.

The nature of the printing process permit controlled application of dielectric layers 496 creates recesses 498 that control the location, cross section, material content, and aspect ratio of the conductive traces 492 and the vias 494. Maintaining the conductive traces 492 and vias 494 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 498 to control the aspect ratio of the conductive traces 492 and the vias 494 results in a more rectangular or square cross-section, with the corresponding improvement in signal integrity.

In another embodiment, pre-patterned or pre-etched thin conductive foil circuit traces are transferred to the recesses 498. For example, a pressure sensitive adhesive can be used to retain the copper foil circuit traces in the recesses 498. The trapezoidal cross-sections of the pre-formed conductive foil traces are then post-plated. The plating material fills the open spaces in the recesses 498 not occupied by the foil circuit geometry, resulting in a substantially rectangular or square cross-sectional shape corresponding to the shape of the recesses 498.

In another embodiment, a thin conductive foil is pressed into the recesses 198, and the edges of the recesses 498 acts to cut or shear the conductive foil. The process locates a portion of the conductive foil in the recesses 498, but leaves the negative pattern of the conductive foil not wanted outside and above the recesses 498 for easy removal. Again, the foil in the recesses 498 is preferably post plated to add material to increase the thickness of the conductive traces 492 in the circuit geometry and to fill any voids left between the conductive foil and the recesses 498.

Figure 25:
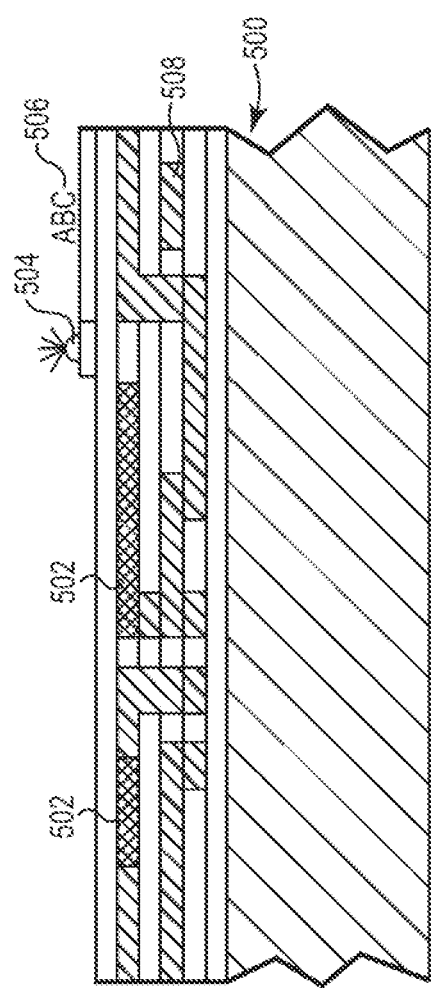
FIG. 25 illustrates an alternate high performance electrical interconnect with printed electrical devices in accordance with an embodiment of the present disclosure.

FIG. 25 illustrates a high performance electrical interconnect 500 with printed electrical devices 502. The electrical devices 502 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 502 include printed LED indicator 504 and display electronics 506. Geometries can also be printed to provide capacitive coupling 508. Compliant material can be added between circuit geometry, such as discussed above, so the present electrical interconnect can be plugged into a receptacle or socket, supplementing or replacing the need for compliance within the connector.

The electrical devices 502 are preferably printed during construction of the interconnect assembly 500. The electrical devices 502 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 502 can be formed using printing technology, adding intelligence to the high performance electrical interconnect 500. Features that are typically located on other circuit members can be incorporated into the interconnect 500 in accordance with an embodiment of the present disclosure.

The availability of printable silicon inks provides the ability to print electrical devices 502, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 502 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 26:
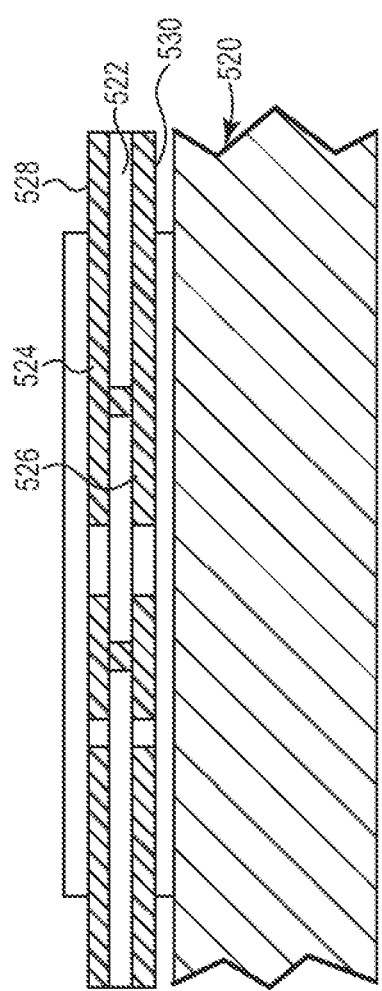
FIG. 26 illustrates an alternate high performance electrical interconnect with printed compliant electrical pads to plug into another connector in accordance with an embodiment of the present disclosure.

FIG. 26 illustrates an alternate high performance electrical interconnect 520 with printed compliant material 522 added between circuit geometries 524, 526 to facilitate insertion of exposed circuit geometries 528, 530 into a receptacle or socket. The compliant material 522 can supplement or replace the compliance in the receptacle or socket. In one embodiment, the compliance is provided by a combination of the compliant material 522 and the exposed circuit geometries 528, 530.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A surface mount electrical interconnect providing an interface between contact pads on an LGA device and a PCB, the electrical interconnect comprising:
    a socket substrate comprising a first surface with a plurality of first openings having first cross-sections, a second surface with a plurality of second openings having second cross-sections, and center openings connecting the first and second openings, the center openings comprising at least one cross-section greater than the first and second cross-sections;
    a plurality of contact members comprising first contact tips locating proximate the first openings, second contact tips located proximate the second openings, and center portions located in the center openings, the center portions comprising a shape adapted to promote flexure of the contact members within the center openings, the contact members comprise a plurality of beams secured together by the first and second sleeves;
    first sleeves attached to the first contact tips, the first sleeves to slide in the first openings generally along axes generally perpendicular to the first surface as the center portions of the contact members flex in the center openings; and
    second sleeves attached to the second contact tips, the second sleeves located in the second openings.

2. The electrical interconnect of claim 1 wherein the second sleeves slides in the second openings generally along axes generally perpendicular to the second surface as the center portions of the contact members flex in the center openings.

3. The electrical interconnect of claim 1 wherein the second sleeves are secured in the second openings.

4. The electrical interconnect of claim 1 comprising solder balls attached to the second contact tips, the solder balls are adapted to electrically and mechanically couple the electrical interconnect to the PCB.

5. The electrical interconnect of claim 1 comprising flexure members located in the center openings adapted to promote flexure of the center portions of the contact members.

6. The electrical interconnect of claim 5 wherein the flexure members are secured to one of the center portions of the contact members or the socket substrate.

7. The electrical interconnect of claim 1 wherein, the center portions of the contact members comprise a serpentine shape.

8. The electrical interconnect of claim 1 wherein the shape of the center portions of the contact members comprises a cross-section greater than the cross-sections of the first and second openings.

9. The electrical interconnect of claim 1 comprising:
    at least one dielectric layer printed on one of the first or second surfaces of the socket substrate, the dielectric layer comprising a plurality recesses; and
    a conductive material deposited in at least a portion of the recesses comprising a circuit geometry electrically coupling at least two of the contact tips.

10. The electrical interconnect of claim 6 wherein the conductive material comprises one of electro-less or electrolytic plating.

11. The electrical interconnect of claim 6 wherein the dielectric layers comprise at least one additional circuitry plane selected from one of a ground plane, a power plane, an electrical connection to other circuit members, a dielectric layer, or a flexible circuit.

12. The electrical interconnect of claim 1 comprising at least one printed electrical device located on the socket substrate and electrically coupled to at least one of the contact members.

13. The electrical interconnect of claim 12 wherein the electrical device is selected from one of shielding, near device decoupling, capacitors, transistors, resistors, filters, signal or power altering and enhancing devices, memory devices, embedded IC devices, RF antennae, and the like.

14. The electrical interconnect of claim 1 comprising:
    at least one dielectric layer printed on one of the first or second surfaces of the socket substrate, the dielectric layer comprising a plurality recesses; and
    an optical quality material deposited in recesses.

15. The electrical interconnect of claim 1 wherein the socket substrate comprises a multi-layered structure.

16. The electrical interconnect of claim 1 wherein the socket substrate comprises a non-moldable feature.

17. An electrical interconnect assembly comprising:
a housing that retains the electrical interconnect of claim 1;
an LGA device located in the housing with contact pads electrically coupled to the first contact tips of the contact members; and
a PCB soldered to the second contact tips located at the second surface of the socket substrate.

18. A surface mount electrical interconnect providing an, interface between contact pads on an LGA device and a PCB, the electrical interconnect comprising:
a socket substrate comprising a first surface with a plurality of first openings having first cross-sections, a second surface with a plurality of second openings having second cross-sections, and center openings connecting the first and second openings, the center openings comprising at least one cross-section greater than the first and second cross-sections;
a plurality of contact members comprising first contact tips locating proximate the first openings, second contact tips located proximate the second openings, and center portions located in the center openings, the center portions flexing in the center openings in response to an axial force applied to the first contact tips;
flexure members located in the center openings adapted to promote flexure of the center portions of the contact members;
first sleeves attached to the first contact tips and located in the first openings, the first sleeves slide in, the first openings generally along axes generally perpendicular to the first surface as the center portions of the contact members flex in the center openings; and
second sleeves attached to the second contact tips and located in the second openings.

19. A surface mount electrical interconnect providing an interface between, contact pads on an LGA device and a PCB, the electrical interconnect comprising:
a socket substrate comprising a first surface with a plurality of first openings having first cross-sections, a second surface with a plurality of second openings having second cross-sections, and center openings connecting the first and second openings, the center openings comprising at least one cross-section greater than the first and second cross-sections;
a plurality of contact members comprising first contact tips locating proximate the first openings, second contact tips located proximate the second openings, and center portions located in the center openings, the center portions flexing in the center openings in response to an axial force applied to the first contact tips;
first sleeves attached to the first contact tips and located in the first openings, the first sleeves slide in, the first openings generally along axes generally perpendicular to the first surface as the center portions of the contact members flex in the center openings; and
second sleeves attached to the second contact tips and located in the second openings.

20. The electrical interconnect of claim 19 wherein the second sleeves slide in the second openings generally along axes generally perpendicular to the second surface as the center portions of the contact members flex in the center openings.

* * * * *